(12) United States Patent
Shim et al.

(10) Patent No.: US 11,597,651 B2
(45) Date of Patent: *Mar. 7, 2023

(54) LAYERED GROUP III-V COMPOUND AND NANOSHEET CONTAINING PHOSPHORUS, AND ELECTRICAL DEVICE USING THE SAME

(71) Applicant: Industry-Academic Cooperation Foundation, Yonsei University, Seoul (KR)

(72) Inventors: Woo-young Shim, Seoul (KR); Hong Choi, Seongnam-si (KR); Min-jung Kim, Gwangju (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 222 days.

This patent is subject to a terminal disclaimer.

(21) Appl. No.: 17/111,215

(22) Filed: Dec. 3, 2020

(65) Prior Publication Data

US 2022/0073351 A1 Mar. 10, 2022

(30) Foreign Application Priority Data

Sep. 9, 2020 (KR) .................. 10-2020-0115373
Nov. 10, 2020 (KR) .................. 10-2020-0149109

(51) Int. Cl.
*C30B 29/44* (2006.01)
*C01B 25/08* (2006.01)
(Continued)

(52) U.S. Cl.
CPC .......... *C01B 25/087* (2013.01); *C30B 28/02* (2013.01); *C30B 29/44* (2013.01); *C30B 29/68* (2013.01);
(Continued)

(58) Field of Classification Search
CPC ......... C30B 28/02; C30B 29/44; C30B 29/68; C01B 25/087; B82Y 30/00; B82Y 40/00; C01P 2004/24; C01P 2006/40
See application file for complete search history.

(56) References Cited

U.S. PATENT DOCUMENTS

2016/0043270 A1* 2/2016 Li .................. H01L 31/0264
257/94
2019/0157386 A1* 5/2019 Ando .................... H01L 29/775

FOREIGN PATENT DOCUMENTS

| JP | 2003261400 A | | 9/2003 |
| JP | 2013514642 | * | 4/2013 |

(Continued)

OTHER PUBLICATIONS

Engin Deligoz, "Exploring mechanical, electronic, vibrational, and thermoelectric properties of CaGa2P2, CaGa2As2, and SrGa2As2", Elsevier Masson, Sep. 2, 2018.

(Continued)

*Primary Examiner* — Robert M Kunemund
(74) *Attorney, Agent, or Firm* — Bridgeway IP Law Group, PLLC; Jihun Kim

(57) ABSTRACT

Proposed are a layered Group III-V compound containing phosphorus, a Group III-V nanosheet that may be prepared using the same, and an electrical device including the materials. There is proposed a layered compound represented by [Formula 1] $M_{x-m}A_yP_z$ (Where M is at least one of Group II elements, A is at least one of Group III elements, x, y, and z are positive numbers which are determined according to stoichiometric ratios to ensure charge balance when m is 0, and 0<m<x).

19 Claims, 8 Drawing Sheets

(51) Int. Cl.
*C30B 28/02* (2006.01)
*C30B 29/68* (2006.01)
*B82Y 30/00* (2011.01)
*B82Y 40/00* (2011.01)

(52) U.S. Cl.
CPC .............. *B82Y 30/00* (2013.01); *B82Y 40/00* (2013.01); *C01P 2004/24* (2013.01); *C01P 2006/40* (2013.01)

(56) References Cited

FOREIGN PATENT DOCUMENTS

| | | | |
|---|---|---|---|
| JP | 2020-176044 | A | 10/2020 |
| KR | 20180103550 | A | 9/2018 |
| KR | 20190132152 | A | 11/2019 |
| KR | 20190132294 | A | 11/2019 |
| KR | 10-2057700 | B1 | 12/2019 |
| KR | 20200073081 | A | 6/2020 |

OTHER PUBLICATIONS

Satyendra Singh, "Optical properties of gallium phosphide (GaP) nanowires", Springer, Apr. 3, 2012.

\* cited by examiner

LAYERED GROUP III-V COMPOUND AND NANOSHEET CONTAINING PHOSPHORUS, AND ELECTRICAL DEVICE USING THE SAME

BACKGROUND OF THE INVENTION

1. Field of the Invention

The present invention relates to a layered Group III-V compound and a nanosheet containing phosphorus, and an electrical device using the same, and more particularly, to a layered compound and a nanosheet containing an alkaline earth metal and containing phosphorus having various electrical properties, and an electrical device using the same.

2. Description of the Related Art

Layered compounds connected to interlayers through van der Waals bonds may show various properties, and the layered compounds may be delaminated through physical or chemical methods to prepare two-dimensional (2D) nanosheets having a thickness of several to hundreds of nanometers, and thus, active research into the layered compounds is underway.

In particular, low-dimensional materials such as nanosheets are expected to have innovative new functions that existing bulk materials fail to provide, and are highly likely to serve as next-generation future materials instead of the existing materials.

However, up until now, the layered compounds having a two-dimensional crystal structure are limited to materials such as graphite, transition metals, and chalcogen compounds to hardly develop into materials of various compositions.

Meanwhile, Group III-V compounds containing phosphorus such as gallium phosphide or aluminum phosphide may be widely used in various electrical devices as a compound semiconductor material but Group III-V phosphorus compounds having a layered structure are not specifically known till now.

The Group III-V phosphorus compounds having a layered structure, unlike existing Group III-V phosphorus compounds having a different crystal structure, are expected to allow diversified application, and to be applicable to new areas that have not been reached before.

RELATED ART DOCUMENT

Patent Document

Korean Registered Patent Publication No. 10-2057700
Korean Patent Laid-open Publication No. 2019-0132294
Korean Patent Laid-open Publication No. 2019-0132152

SUMMARY OF THE INVENTION

According to an embodiment of the invention, there are provided a layered Group III-V compound containing phosphorus, a Group III-V nanosheet that may be prepared using the same, and an electrical device including the materials.

According to a first aspect of the invention, there is provided a layered compound represented by Formula 1 below.

$$M_{x-m}A_yP_z \quad \text{[Formula 1]}$$

(Where M is at least one of Group II elements, A is at least one of Group III elements, x, y, and z are positive numbers which are determined according to stoichiometric ratios to ensure charge balance when m is 0, and 0<m<x).

According to a second aspect of the invention, there is provided a nanosheet including a compound represented by Formula 1 below and, and prepared through a physical or chemical peeling method.

According to a third aspect of the invention, there is provided an electrical device including the layered compound of the first aspect or the nanosheet of the second aspect.

Embodiments of the invention may provide a layered Group III-V phosphorus compound or nanosheet having various compositions, and the compound and the nanosheet may have various electrical properties to enable application to various electrical devices.

DETAILED DESCRIPTION OF THE EXEMPLARY EMBODIMENTS

Figure 1:
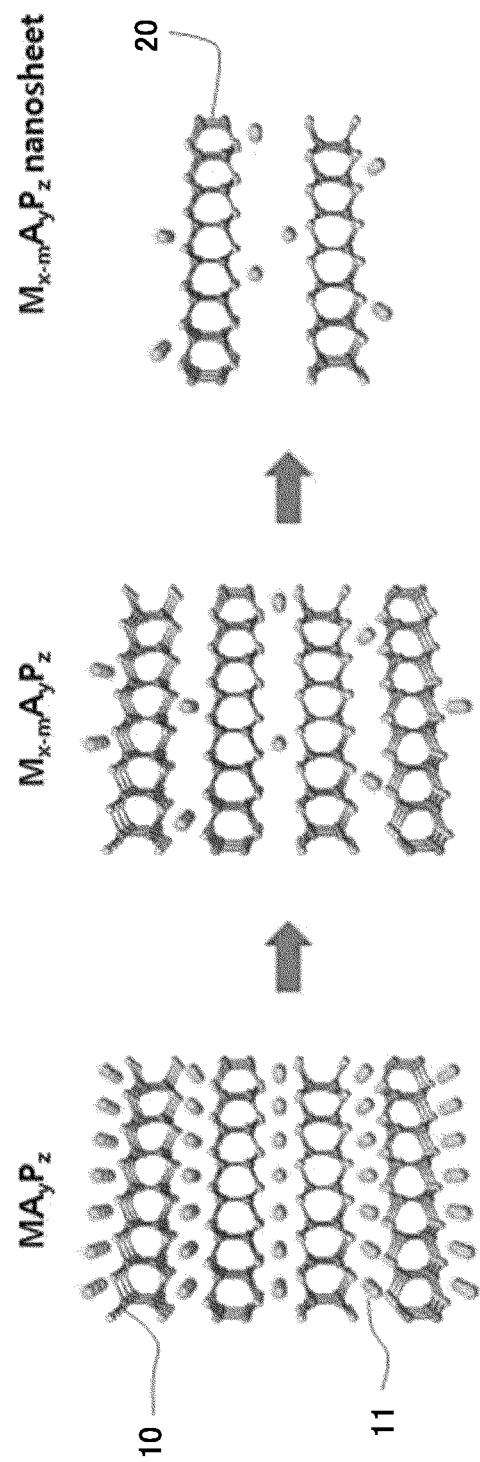
FIG. 1 is a conceptual view illustrating a layered Group III-V phosphorus compound according to an embodiment of the invention and a nanosheet prepared using the same.

Hereinafter, configuration and operation of embodiments of the invention will be described with reference to the accompanying drawings. In the following description, when it is determined that the specific description of the known related art unnecessarily obscures the gist of the invention, the detailed description thereof will be omitted. In addition, when an element "includes" a component, it may indicate that the element does not exclude another component unless explicitly described to the contrary, but can further include another component.

A compound according to an embodiment of the invention is represented by Formula 1 and has ferroelectric-like properties.

$$M_{x-m}A_yP_z \quad \text{[Formula 1]}$$

(Where M is at least one of Group II elements, A is at least one of Group III elements, x, y, and z are positive numbers which are determined according to stoichiometric ratios to ensure charge balance when m is 0, and 0<m<x).

The compound of an embodiment of the invention has a layered structure, and in general, Group III-V phosphorus compounds such as a GaP compound or an InP compound have a three-dimensional structure, having difficulty in exhibiting a layered structure. In order to overcome the limitation, inventors of the invention added Group II elements (hereinafter referred to as an "additive element") to a Group III-V compound (hereinafter referred to as a "Group III-V compound") to place the additive elements between Group III-V compound layers to prepare a layered compound in which the Group III-V compound layers are connected. The additive elements positioned between the Group III-V compound layers provide a weak bond between the Group III-V compound layers through van der Waals force, and thus a plane on which the additive elements are positioned forms a cleavage plane that easily separates along the plane.

Accordingly, the layered compound according to an embodiment of the invention may be easily peeled off into the Group III-V compound layers along the cleavage plane through either or both physical or chemical methods, and the peeling is more easily achieved with an increasing amount of the additive elements removed. Therefore, a Group III-V compound nanosheet may be easily prepared from the layered compound, and in this case, the additive elements partially remain in the Group III-V compound nanosheet.

With the continuous removal of the additive elements, the interlayer distance between the Group III-V compound layers gradually becomes greater, and eventually the interlayer bond breaks down, which may cause cracks between the layers. Therefore, the layered structure of the layered compound described in an embodiment of the invention includes a case where repeating two-dimensional Group III-V compound layers are interlayer-bonded through van der Waals bonds by additive elements as well as a case where the interlayer bonding force of the Group III-V compound is completely or partially removed to increase the interlayer distance, thereby forming cracks.

In addition, the two-dimensional Group III-V phosphorus compound layers may exhibit a two-dimensional bonding structure before the removal of additive elements, but when the additive elements are removed greater than a certain level, the bonding structure may change in the Group III-V compound layers, and the structure change may include a change from a two-dimensional bonding structure before the removal to a three-dimensional bonding structure or an amorphous structure. However, even in this case, since the compound layers keep the two-dimensional shape, except the change in the crystal structure in the layers, the compound layers still exhibit the layered structure due to the structure that the interlayer bonding keeps the van der Waals bonds by additive elements.

Therefore, in an embodiment of the invention, the layered structure includes a case where the Group III-V compound layers form two-dimensional bonds in respective layers and form interlayer-bonds through van der Waals bond by additive elements as well as a case where cracks are formed between the layers with the removal of additive elements, and further includes a case where the Group III-V compound layers are three-dimensionally bonded, but these layers keep a two-dimensional shape, and the bond between these layers is a van der Waals bond by additive elements rather than a bond between Group III-V compounds or the bonding force is completely or partially removed, thereby forming cracks.

A conceptual view for examples of the layered compound and a nanosheet prepared therefrom is shown in FIG. 1. First, a layered Group III-V compound is synthesized using additive elements. In this case, the layered Group III-V compound keeps a layered structure through additive elements 11, the additive elements 11 which are Group II elements, are positioned between $A_yP_z$ layers 10 which are Group III-V compounds, to keep the bonding between the layers 10 through the van der Waals bonds, and when the additive elements 11 are removed, the bonding force between the $A_yP_z$ layers 10 in $M_{x-m}A_yP_z$ decreases or the interlayer distance increases, thereby forming cracks, and accordingly, in the end, a $M_{x-m}A_yP_z$ nanosheet 20 is prepared by being peeled off from the layered compound.

The nanosheet 20 prepared when peeled off from the layered compound is formed of a plurality of $A_yP_z$ layers of two or more overlapping each other, and may thus be several hundreds of nm thick. In general, nanosheets may exhibit anisotropy according to a two-dimensional shape only when a thickness to a lateral width is less than a certain level. To this end, the ratio of a thickness (d) to a width (L) of a nanosheet (d/L) is preferably 0.1 or less. A width of the nanosheet prepared through an embodiment of the invention may be 5 μm or more, and thus, a thickness of the nanosheet is preferably 500 nm or less.

As described above, the nanosheet according to an embodiment of the invention is a sheet peeled off from the layered compound, which includes two or more two-dimensional Group III-V compound layers, and includes a case where the Group III-V compound layers, when provided in plurality, are bonded through van der Waals bonds by additive elements. In this case, the two-dimensional Group III-V compound layers may have a two-dimensional bonding structure or a three-dimensional bonding structure.

The peeling method may be physical or chemical peeling, and a generally known peeling method using a tape may be used. In addition, to enable easier peeling, the peeling may be performed through irradiation with ultrasonic waves in a liquid state or using a tape after chemical treatment in an acid or base solution.

Additive elements may be Group II elements such as Mg, Ca, Sr, Ba, etc. In particular, Mg and Ca may be advantageous as additive elements to synthesize layered compounds.

Group III-V compounds forming $A_yP_z$ layers include, for example, GaP, InP, AlP, etc. that may be used in various electrical devices, and an embodiment of the invention is not necessarily limited to the exemplified compounds.

Residual additive elements may satisfy $0<m<x$, preferably $0.1x \leq m \leq 0.8x$, and more preferably $0.2x \leq m \leq 0.7x$, according to Formula 1 described above. In preparing a Group III-V compound having a layered structure, it is preferable that additive elements to prepare a layered structure are completely removed. However, in the compound according to an embodiment of the invention, the additive elements to form a layered structure are not completely removed as the composition range described above and controlled such that a certain amount of the additive elements remains, so that new electrical properties such as ferroelectric-like properties are implemented in the Group III-V compound having a layered structure.

In $M_{x-m}A_yP_z$ of Formula 1 above, x, y, and z refer to positive numbers at which M, A, and P elements have a charge balance according to stoichiometric ratios. In this case, as m is greater than 0 and smaller than x, vacancy is created in the place of additive elements M.

When the vacancy is created, the additive elements M positioned between the $A_yP_z$ layers may move between the layers by an external magnetic field or electric field, and accordingly, the layered compound may exhibit ferroelectric-like properties.

In general, ferroelectric-like properties are found in oxides of an asymmetric structure such as $BaTiO_3$ having a perovskite structure. In the oxides of an asymmetric structure such as $BaTiO_3$, ferroelectric-like properties are shown according to changes in the position of Ba located in the center.

In contrast, the layered compound and nanosheet according to an embodiment of the invention exhibit ferroelectric-like properties due to the movement of additive elements between the layers, despite having a polar-symmetry structure instead of the asymmetric structure.

In this stable $M_xA_yP_z$, as the partial removal of the additive elements M comes with ferroelectric-like properties, m has to be greater than 0, and smaller than x to make sure that at least some of the additive elements remain.

Meanwhile, when m is removed in a too small amount, the movement between the layers may not be easy, and thus, m is 0.1x or greater, and when m is removed in an excessive amount, the layered structure may break down or the crystal structure may change, thereby failing to achieve ferroelectric properties, and thus, m is preferably 0.8x or less, and more preferably 0.2x to 0.7x. In this case, the layered compound or the nanosheet may exhibit a two-dimensional bond structure to have a space group of P63/mmc.

In addition, with an increase in m, the crystal structure of the Group III-V compound layers may change, and in particular, the structure may change to a zinc blende structure of existing GaP or InP. For example, in the case where the Group III-V compound is $CaIn_2P_2$, when x is greater than 0.8, the structure may change to a zinc blende structure, and despite the change to the zinc blende structure, the layered structure is kept because the bonding between the Group III-V compound layers is still formed by the residual additive elements, and the residual additive elements may allow the Group III-V compound layers to exhibit electrical properties such as ferroelectric properties.

In addition, the layered compound and nanosheet according to an embodiment of the invention may exhibit resistance switching properties.

When a material has resistance switching properties, current does not increase linearly according to voltages applied to the material, but when an initial voltage is applied, the material keeps a high resistance state to have an insignificant increase in the current and then when the material reaches a certain critical point, the material switches to a low resistance state to have a sharp increase in the current.

These resistance switching properties are generally found in oxides, and recently, using these properties, memory devices such as a memristor capable of storing information like a flash memory have been actively developed.

When preparing a Group III-V compound according to an embodiment of the invention or a nanosheet formed of the compound, M as an additive element is added to synthesize a layered compound having a composition of $M_xA_yP_z$, and then the additive element, M is partially removed using an acid, and a layered compound having a composition of $M_{x-m}A_yP_z$ may thus be prepared.

As such, when the additive element is removed through the strong acid, the place where the additive element is partially removed is replaced with hydrogen ions included in the strong acid, and as shown in Formula 2 below, a hydrogen-containing layered compound and nanosheet may be prepared.

$$M_{x-m}H_nA_yP_z \qquad \text{[Formula 2]}$$

(Where M is at least one of Group II elements, A is at least one of Group III elements, x, y, and z are positive numbers which are determined according to stoichiometric ratios to ensure charge balance when m is 0, and 0<m<x, and 0<n≤m).

As described above, the range of m may be preferably equal to or more than 0.1x and equal to or less than 0.8x, and more preferably equal to or more than 0.2x and equal to or less than 0.7x. Even in this case, the crystal structure may have a space group of P63/mmc.

Meanwhile, m may be greater than 0.8, and accordingly, the layered compound and nanosheet may have a zinc blende structure.

As such, the hydrogen-containing layered compound and nanosheet may have ferroelectric-like properties despite having a polar-symmetry structure as described above, and have resistance switching properties as well to be applied to various electrical devices, and in particular, to become applicable to memory devices such as memristors.

Example 1

1) Synthesis of $CaGa_2P_2$ Having a Layered Structure

Ga, Ga, and P were weighed at a molar ratio of 1:2:2, placed in an alumina crucible, and additionally 4 times gallium was added thereto to achieve the total molar ratio of 1:10:2. Next, the mixture was placed in a quartz tube which was then double-sealed to block outside air. Thereafter, the added raw materials were heated to 1000° C. to be entirely liquefied and kept at the same temperature for 40 hours.

Subsequently, the resultant was subjected to cooling at a rate of 10° C. per hour to room temperature, and the collected sample was washed with a hydrochloric acid solution and deionized water to remove residual P and Ga to synthesize $CaGa_2P_2$.

2) Removal of Ca

Ca ions were removed from the layered $CaGa_2P_2$ through nitric acid.

The amount of Ca removal was controlled at varied concentration and time of nitric acid, and the results are shown in the Table below.

TABLE 1

| Name of sample | Removal of additive elements | Reaction time | Residual Ca (at %) |
|---|---|---|---|
| Sample A | — | — | 20.3 |
| Sample B | 30% nitric acid | 12 minutes | 15.5 |
| Sample C | 10% hydrofluoric acid | 30 minutes | 11.4 |
| Sample D | 30% nitric acid | 18 minutes | 6.85 |
| Sample E | 30% nitric acid | 30 minutes | 4.1 |
| Sample F | 30% nitric acid | 60 minutes | 2.6 |
| Sample G | 30% nitric acid | 24 hours | 1.9 |

3) Process of Preparing Nanosheets

The samples prepared as in Table 1 above were irradiated with ultrasonic waves in ethanol to prepare nanosheets peeled off therefrom using a tape.

Example 2

1) Synthesis of $CaIn_2P_2$ Having a Layered Structure

Ca, In, and P were weighed at a molar ratio of 1:2:2, mixed, and then put into an alumina crucible. Next, the mixture was placed in a quartz tube which was then double-sealed to block outside air. The process was performed in a glove box under argon atmosphere. Thereafter, in the box furnace, the temperature was raised to allow all Ca, In, and P to be present as a liquid, which were kept for 20 hours, cooled to 500° C. for 100 hours, and kept again for 100 hours to obtain a sample of $CaIn_2P_2$.

2) Removal of Ca

The sample was subjected to reaction in a 30% nitric acid IPA mixed solution over time to remove Ca from the layered $CaIn_2P_2$. Changes in the elemental ratio of In came along with the removal of Ca, and the results are shown in the table below.

TABLE 2

| Name of sample | Reaction time | Elemental ratio |
| --- | --- | --- |
| Sample A | — | Ca:In:P = 1:2:2 |
| Sample B | 10 minutes | Ca:In:P = 0.4:1.6:2 |
| Sample C | 20 minutes | Ca:In:P = 0.2:0.6:2 |
| Sample D | 30 minutes | Ca:In:P = 0.17:2.1:2 |

3) Process of Preparing Nanosheets

The samples prepared as in Table 2 above were irradiated with ultrasonic waves in ethanol to prepare peeled nanosheets using a tape.

Results of analyzing the samples prepared according to Examples 1 and 2 will be described below.

FIGS. 2A to 4 show results of analyzing the samples prepared according to Example 1.

Figure 2A:
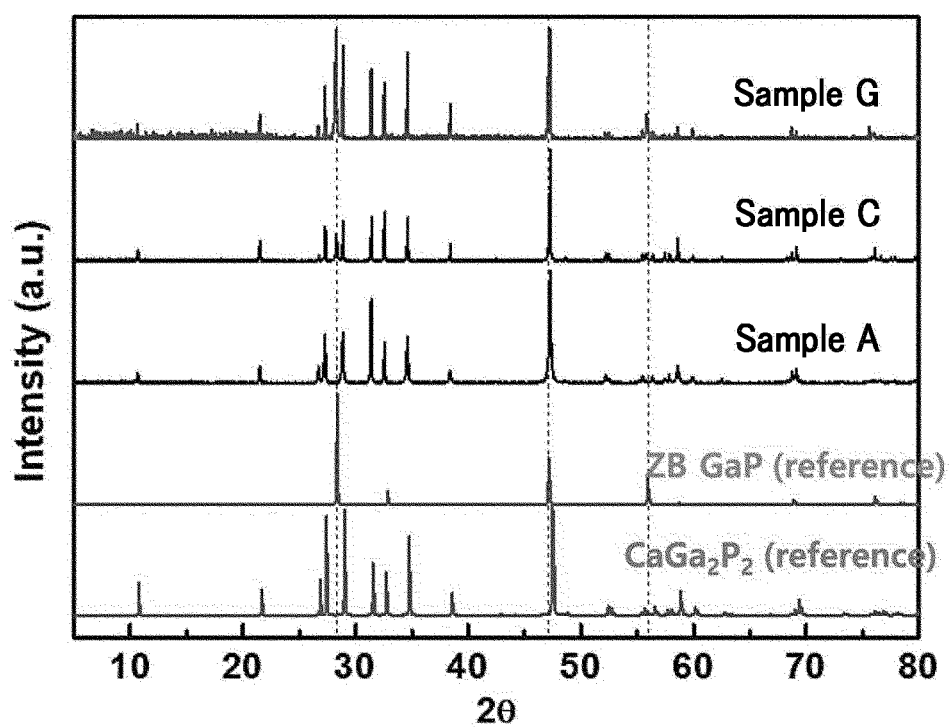
FIGS. 2A and 2B are results of analyzing samples according to Example 1 of the invention.

FIG. 2A shows peaks according to the reference data value of $CaGa_2P_2$, peaks according to the reference data value of GaP (F-43m space group) of the zinc blende structure in XRD analysis, and results of XRD analysis for Samples A, C, and G in Example 1. It was confirmed that with a decrease in the amount of Ca, the peaks corresponding to the zinc blende GaP that was not present in Sample A became greater. Accordingly, it was seen that the Ca fraction in the material decreases with an etching being performed, and in this process, the P63/mmc space group of $CaGa_2P_2$ gradually switched to GaP of the zinc blende structure having the F-43m space group.

However, even when changed to the zinc blende structure as such, the layered structure still stays as it is, because even when Ca positioned between the GaP layers is removed, the plane where Ca occupied still forms a cleavage plane or cracks.

Figure 2B:
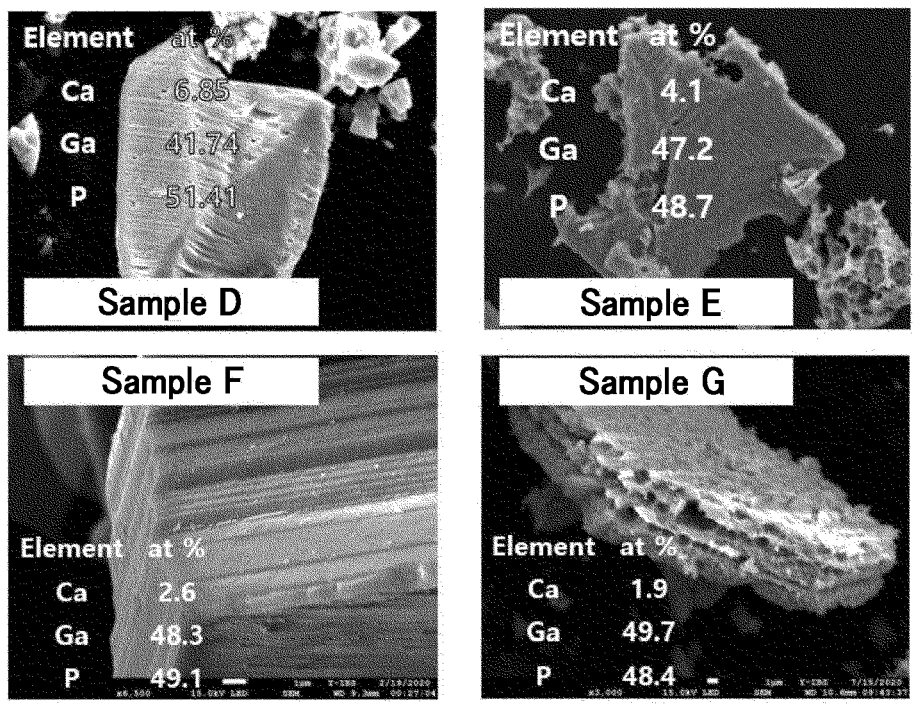

This change is shown in FIG. 2B, and it is seen that Samples D, E, F, and G all have a zinc blende structure, but still have a layered structure as before Ca was removed. In particular, in Sample G from which Ca was removed by the most amount, cracks were formed between the layers due to an increase in the interlayer distance, and the resulting sample was peeled off and dispersed to prepare nanosheets. The layer between cracks may include a plurality of GaP layers.

Figure 3:
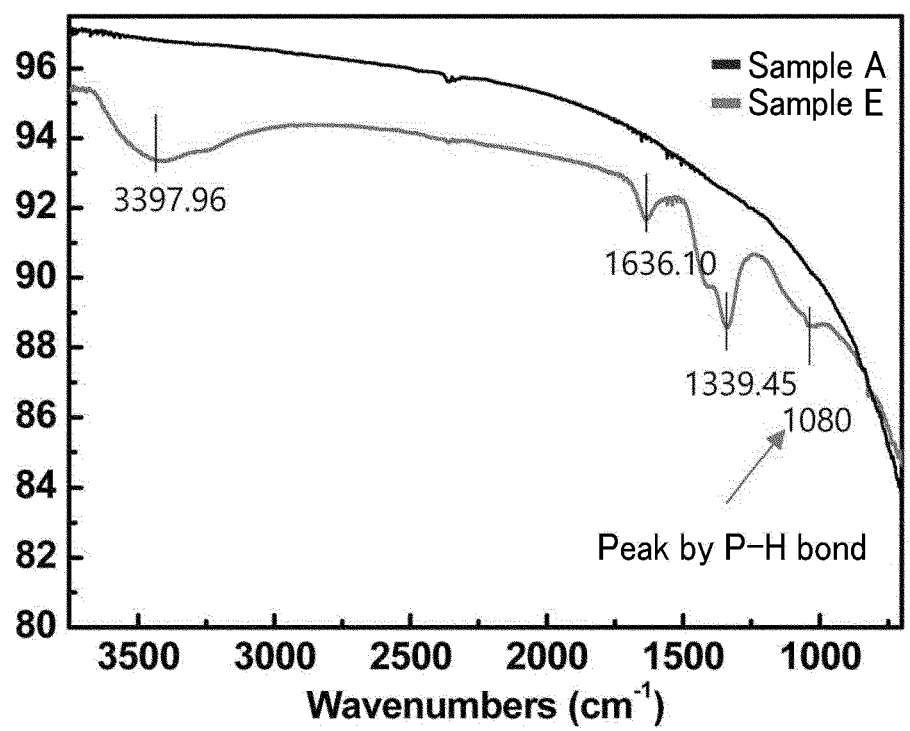
FIG. 3 is results of Fourier-transform infrared spectroscopy (FT-IR) analysis of samples according to Example 1 of the invention.

FIG. 3 shows results of Fourier-transform infrared spectroscopy (FT-IR) analysis, and Sample E from which Ca was removed with nitric acid in Example 1, showed peaks according to P—H bonds at the position of 1,080 cm-1 in the range of 1,150 cm-1 to 950 cm-1, but the graph of Sample A, a layered compound before the additive elements were removed, showed no peaks in the wavelength range.

Figure 4:
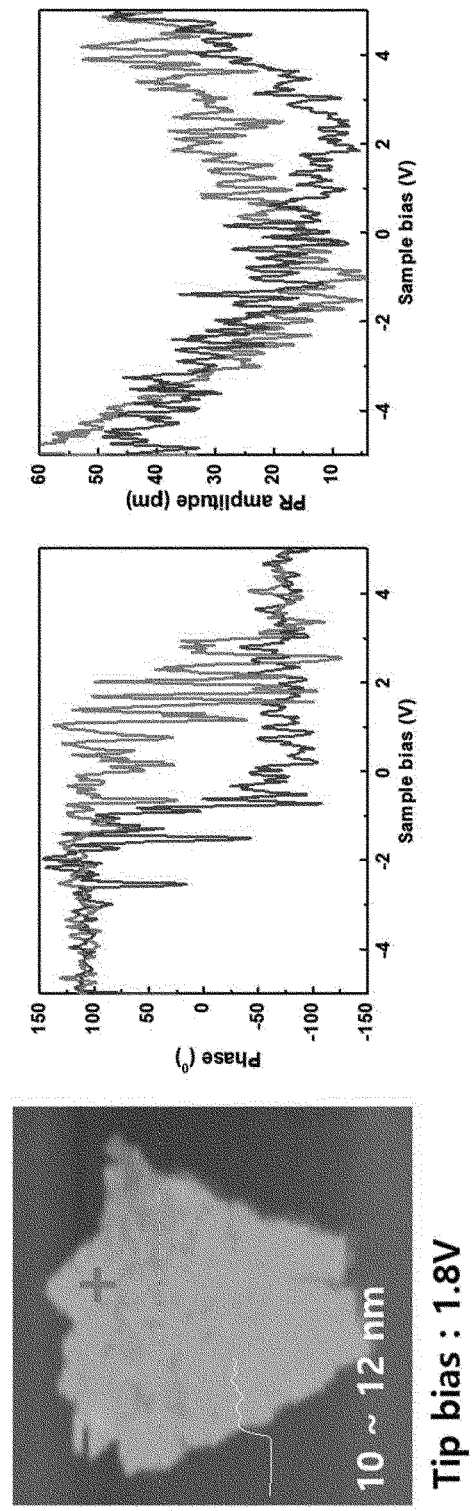
FIG. 4 is results of analyzing electrical properties of samples according to Example 1 of the invention.

In FIG. 4, an atomic force microscopy (AFM) image of the nanosheet peeled off to 10 nm to 12 nm in Sample D is shown and the ferroelectric properties of the nanosheet were measured through PFM, and hysteresis curves therefrom are shown. It was found that the nanosheet had ferroelectric properties applicable to actual electrical devices having a coercive voltage of ±2V for each voltage direction.

Figure 5A:
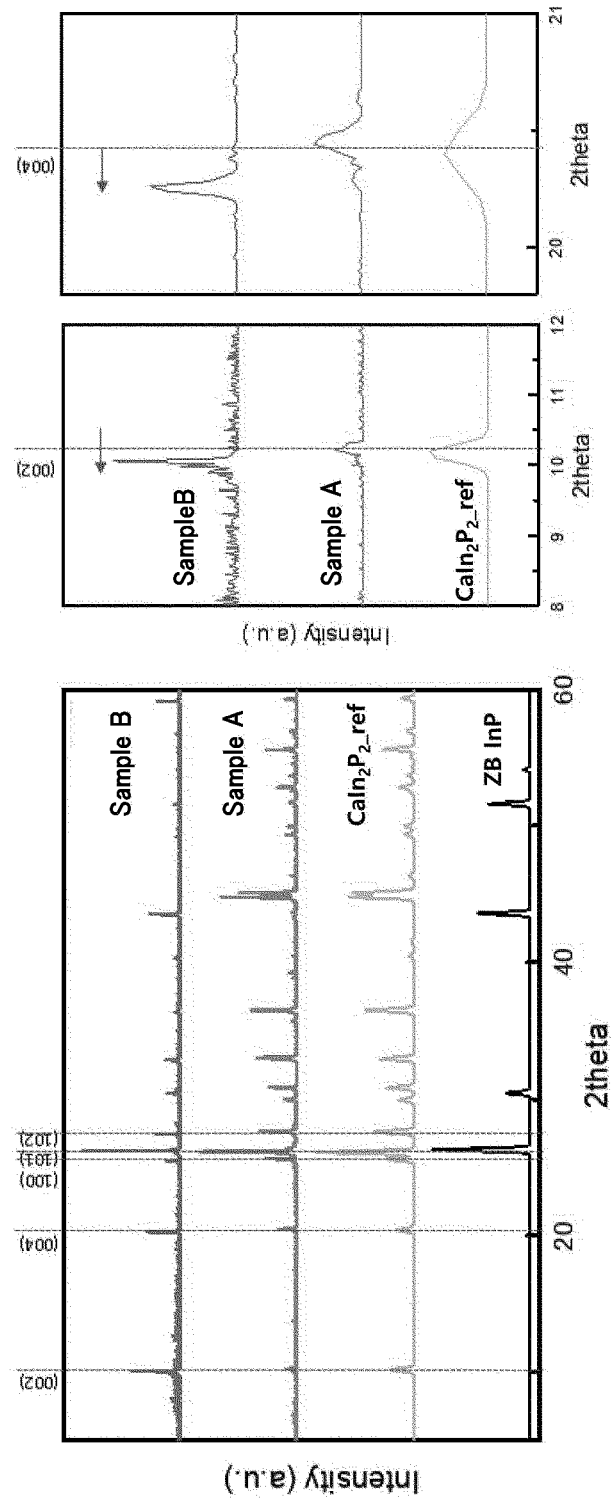
FIG. 5A to 5B are results of analyzing samples according to Example 2 of the invention.
Figure 6A:
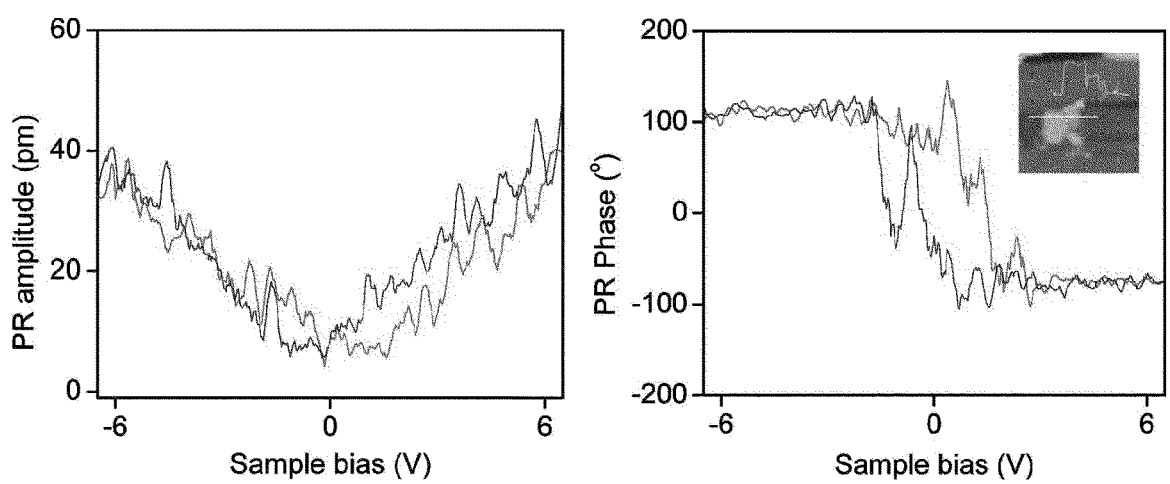
FIGS. 6A and 6B are results of analyzing electrical properties of samples according to Example 2 of the invention.
Figure 6B:
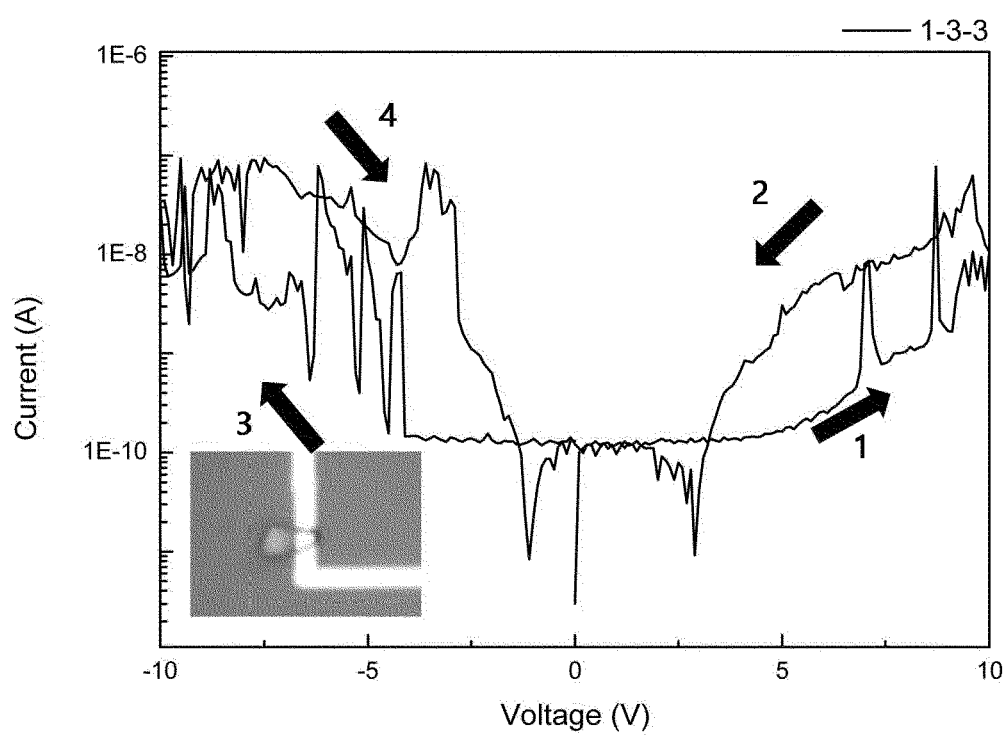

FIGS. 5A and 6B show results of analyzing the samples prepared according to Example 2.

FIG. 5A is a graph showing patterns according to XRD analysis, and shows reference data peaks of InP (ZB InP) of a zinc blende structure, reference data peaks of $CaIn_2P_2$ ($CaIn_2P_2$_ref), and data peaks of Sample A of Example 2 (Sample A), and data peaks of Sample B (Sample B). The peaks on the (002) plane were not observed in ZB InP, and the peaks on the (002) plane in Sample B from which Ca was partially removed were observed to move to a low angle compared to the peaks on the (002) plane in Sample A before Ca was removed and the reference data of $CaIn_2P_2$. However, even in this case, the peaks were present, indicating that the crystal structure was kept even after Ca was partially removed.

Figure 5B:
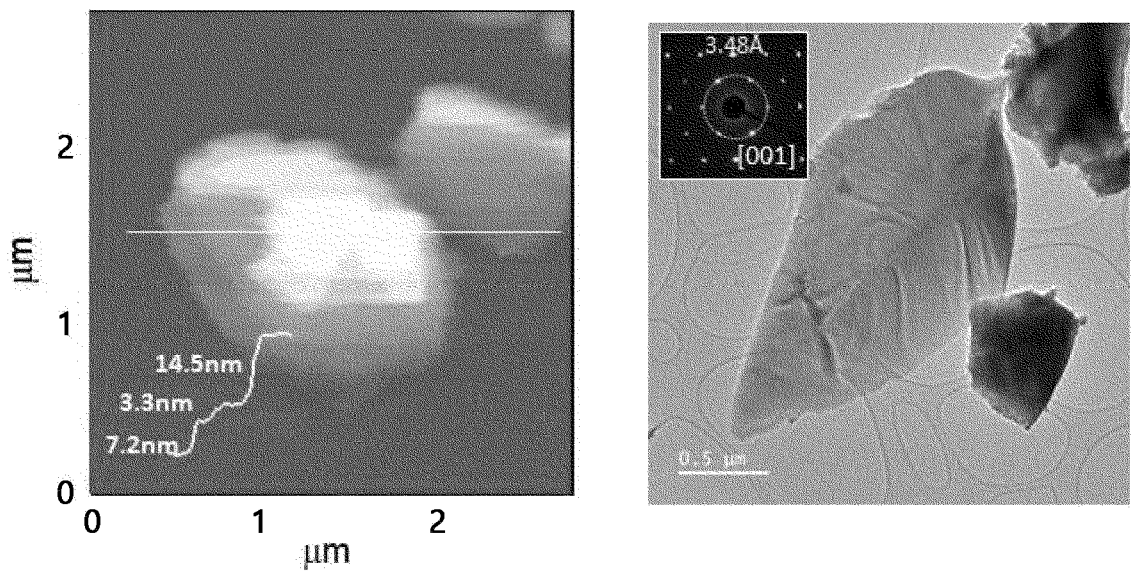

FIG. 5B shows an AFM image of a nanosheet peeled off from Sample B of Example 2 and a line profile therefrom, and transmission electron microscopy (TEM) images and selected area electron diffraction (SAED) patterns. It was seen through the AFM line profile and TEM images that Sample B was peeled off to turn into a thin two-dimensional nanosheet, and through the SAED patterns, it was seen that the nanosheet kept the [001] zone-axis of the P63/mmc structure.

In FIG. 6A, results of measuring ferroelectric properties through PFM in a nanosheet peeled off from Sample B and a hysteresis loop therefrom are shown. The nanosheet had ferroelectric properties applicable to actual electrical devices.

In addition, current changes according to voltages were measured for the nanosheet peeled off from Sample B, and results are shown in FIG. 6B. It was found that at an initial voltage, the nanosheet kept a high resistance state 1, indicating a low current flow, but when the voltage was greater than a certain level, the nanosheet switched to a low resistance state 2, indicating a sharp increase in the current, thereby exhibiting resistance switching properties.

What is claimed is:

1. A layered compound represented by Formula 1 below:

$$M_{x-m}A_yP_z \quad [\text{Formula 1}]$$

(where M is at least one of Group II elements, A is at least one of Group III elements, x, y, z are positive numbers which are determined according to stoichiometric ratios to balance a charge when m is 0, and 0<m<x).

2. The layered compound according to claim 1, wherein them satisfies 0.1x≤m≤0.8x.

3. The layered compound according to claim 1, wherein the m satisfies 0.2x≤m≤0.7x.

4. The layered compound according to claim 1, wherein the M is Ca.

5. The layered compound according to claim 1, wherein A is Ga, In or a combination thereof.

6. The layered compound according to claim 1, wherein the layered compound further comprises H.

7. The layered compound according to claim 1, wherein the layered compound is represented by Formula 2 below:

$$M_{x-m}H_aA_yP_z \quad [\text{Formula 2}]$$

(where M is at least one of Group II elements, A is at least one of Group III elements, x, y, and z are positive numbers which are determined according to stoichiometric ratios to ensure charge balance when m is 0, and 0<m<x, and 0<a≤m).

8. The layered compound according to claim 1, wherein a crystal structure of the layered compound exhibits a space group of P63/mmc.

9. The layered compound according to claim 1, wherein the layered compound has a zinc blende crystal structure.

10. The layered compound according to claim 1, wherein the layered compound exhibits ferroelectric-like properties.

11. The layered compound according to claim 1, wherein the layered compound exhibits resistance switching properties.

12. A nanosheet comprising a compound represented by Formula 1 below, and prepared through a physical or chemical peeling method:

$$M_{x-m}A_yP_z \quad \text{[Formula 1]}$$

(where M is at least one of Group II elements, A is at least one of Group III elements, x, y, z are positive numbers which are determined according to stoichiometric ratios to balance a charge when m is 0, and $0 \leq m < x$).

13. The nanosheet according to claim 12, wherein the M is Ca.

14. The nanosheet according to claim 12, wherein the A is Ga, In or a combination thereof.

15. The nanosheet according to claim 12, wherein a crystal structure of the nanosheet has a space group of P63/mmc.

16. The nanosheet according to claim 12, wherein the nanosheet is a zinc blende crystal structure.

17. The nanosheet according to claim 12, wherein the nanosheet exhibits ferroelectric-like properties.

18. The nanosheet according to claim 12, wherein the nanosheet exhibits resistance switching properties.

19. An electrical device comprising the layered compound according to claim 1.

* * * * *